United States Patent [19]

Nelson et al.

[11] Patent Number: 4,661,886

[45] Date of Patent: Apr. 28, 1987

[54] MAGNETICALLY SEALED MULTICHIP INTEGRATED CIRCUIT PACKAGE

[75] Inventors: John A. Nelson, San Diego; Dale L. Robinson, Escondido, both of Calif.

[73] Assignee: Burroughs Corporation, Detroit, Mich.

[21] Appl. No.: 783,616

[22] Filed: Oct. 3, 1985

[51] Int. Cl.[4] ............................................. H01L 23/02
[52] U.S. Cl. .................................... 361/399; 361/400; 357/75
[58] Field of Search .............. 361/400, 403, 395, 399; 174/52 FP, 52 S; 357/75, 74

[56] References Cited

U.S. PATENT DOCUMENTS 4,012,723 3/1977 Harper ..................... 174/52 FP X
4,295,181 10/1981 Chang et al. ................. 361/403 X Primary Examiner—A. d. Pellinen
Assistant Examiner—T. De Boer
Attorney, Agent, or Firm—Charles J. Fassbender; Kevin R. Peterson

[57] ABSTRACT

A magnetically sealed integrated circuit package includes a substrate having a cavity for holding multiple integrated circuit die, a lid for covering the cavity to protect the die, a ferromagnetic seal ring which is fixed to the substrate around the die, and a magnet which is fixed to the lid and coincides in shape to the seal ring for magnetically attracting the seal ring to hold the lid in place when the lid covers the cavity.

13 Claims, 3 Drawing Figures

MAGNETICALLY SEALED MULTICHIP INTEGRATED CIRCUIT PACKAGE

BACKGROUND OF THE INVENTION

This invention relates to integrated circuit packages; and more particularly, it relates to those packages which contain multiple very large scale integrated circuit die (VLSI die).

As used herein, an integrated circuit package is an electromechanical assembly which is configured to completely enclose an integrated circuit die, and which includes a plurality of electrical conductors that carry signals to and from the die. In a multichip integrated circuit package, several die are enclosed.

Typically, all of the die of a multipchip package are attached by solder or epoxy to a substrate in the package in an assembly area. These attachments are then visually inspected for faults and repaired. Bonding wires are then attached between the die and the conductors in the package; and they are then visually inspected for faults and repaired.

Then the package is moved from the assembly area to a test area. There the package is inserted into a tester which applies electrical signals to the conductors and analyzes the response signals to determine if the diie function electrically. If the package fails this test, it is moved back to the assembly area where each defective die is removed and replaced with a new die. Then the above described assembly procedure of visually inspecting the die, attaching bonding wires, etc. is repeated.

Packages which pass the electrical test are then moved to another assembly area in which the die are enclosed by a hermetically sealed lid. To form this seal, an epoxy, or a seam seal weld, or a laser weld is typically used. These packages are then moved to another test area where additional "burn-in" tests are performed before the packages are shipped to a customer. Burn-in tests typically include testing the electrical operation of the die under various extreme temperature or humidity conditions and testing the hermeticity of the lid seal.

Such an assembly procedure works well for packages in which the chips are relatively small—i.e., chips of the SSI, MSI or LSI type. However, it has been determined by the current inventors that the above assembly procedure has serious drawbacks when the chips in the package are of the VLSI type. One reason for this is that as the amount of circuitry on a chip increases, the number of input/output signals and bonding wires to the chip also increases; and to accommodate this increase, the bonding wires are placed closer together. Eventually, however, a point is reached at which defective bonding wires can no longer be repaired.

State of the art VLSI chips are being designed to contain between 100 and 300 bonding wires. These wires, for example, may be only 1.3 mils in diameter and only 5 mils apart. With so many small wires and such a small spacing, it is essentially not feasible to remove and replace a siingle bonding wire without damaging an adjacent wire. Also, bonding pads on the die have a similarly small size and spacing; so attempts to repair a defective wire often damages its small, fragile die bonding pad.

In the above described assembly procedure, the bonding wires are susceptible to being mechanically damaged from the time the package leaves the assembly area to the time the package lid is installed. Such damage can occur, for example, if the package is misinserted into the machine which electrically tests the die. Also, an object which is accidentally dropped into the package will damage the bonding wires. Even a worker who happens to sneeze on the package will damage or short the bonding wires together because they are so small, fragiile, and closely spaced.

VLSI die circuitry, as compared to SSI, MSI, or LSI die circuitry, is also much more susceptible to failure due to the presence of foreign particles or contaminants. This is because in order to increase the amount of circuitry on a die, the dimensions of the circuit components are scaled down; and as the circuit components become smaller in size, they become more sensitive to trace quantities of contaminants and the chemical reactions that they cause.

In the above described prior art assembly procedure, the die are susceptible to contamination from the time they leave the assembly area until a lid is hermetically attached to the package. Sources of this contamination include moisture or dust in the air, and trace amounts of acids or oils on the fingers of workers who handle the packages. Such contamination is very diffiicult to detect since a few parts per million of foreign particles will cause a circuit to fail only several months after the package is tested and shipped.

Accordingly, a primary object of the invention is to provide a novel multichip VLSI integrated circuit package which avoids the above described problems.

BRIEF SUMMARY OF THE INVENTION

This object and others are achieved by an improved integrated circuit package of the type which includes a substrate for holding multiple VLSI die, and includes a lid for covering and protecting the die; wherein the improvement comprises a ferromagnetic seal ring which is fixed to the substrate, and a magnet which is fixed to the lid and is disposed to attract the seal ring and magnetically hold the lid in place when the lid covers the die. Preferably, the ferromagnetic seal ring is positioned around the perimeter of the die; and the magnet also is ring shaped, is attached to the perimeter of the lid, and is imbedded in rubber which compresses against the seal ring to enclose and protect the die and their bonding wires.

Since the lid is held in place magnetically, the lid is easily attached to the package, and the lid-substrate seal is easily broken when defective die are replaced. This enables the die and bonding wires of the package to be covered for protection from the time they are initially attached to the substrate to the time they are hermetically sealed in the package. Further, the magnetic lid leaves no adhesive residue on the seal ring, so the quality of the hermetic seal is not compromised.

BRIEF DESCRIPTION OF THE DRAWINGS

Various features and advantages of the invention are described in detail in the Detailed Description in conjunction with the accompanying drawings wherein.

DETAILED DESCRIPTION OF THE INVENTION

Figure 1:
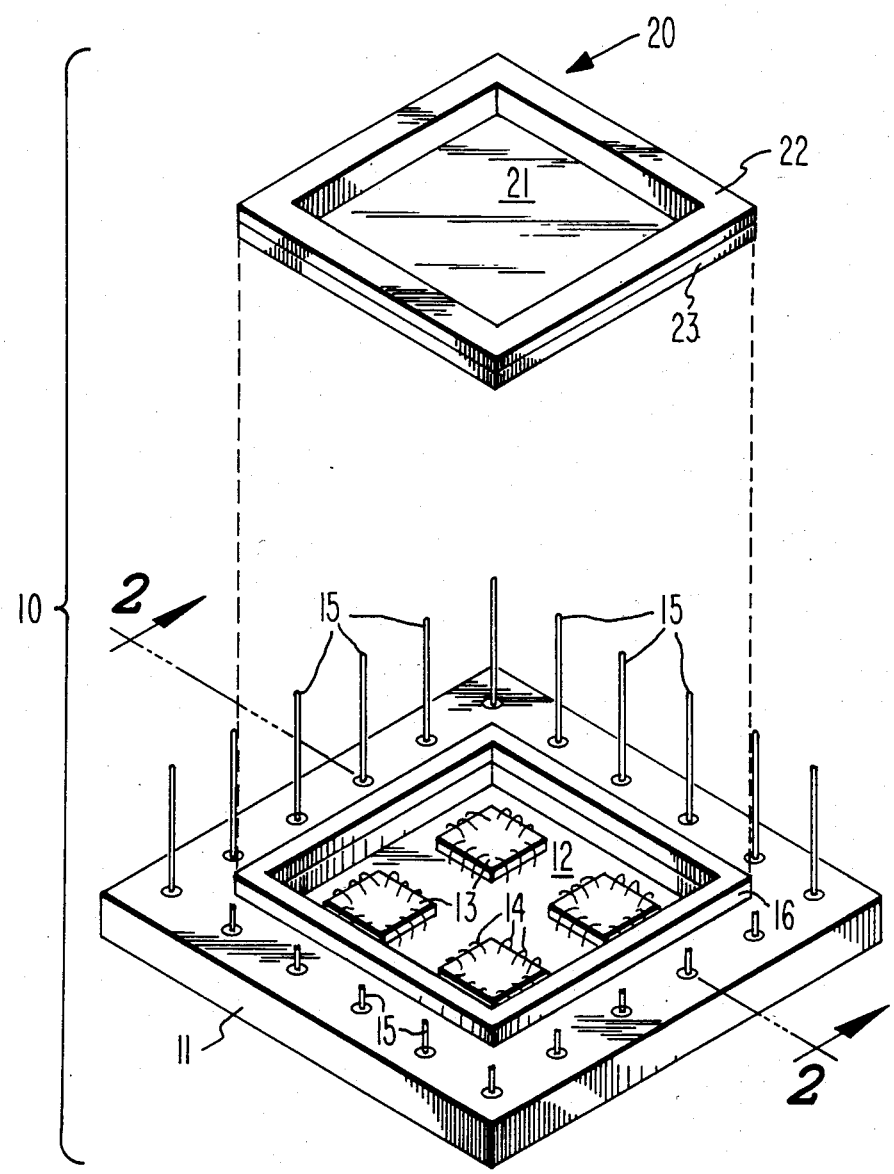
FIG. 1 is a pictorial view of one preferred embodiment of the invention.

Referring now to FIG. 1, the details of an integrated circuit package 10 which is constructed as a preferred embodiment of the invention will be described. Package 10 includes a substrate 11 having a cavity 12 in which a plurality of VLSI die 13 are disposed. Substrate 11 is made of three fat layers of ceramic which are laminated together.

Each die 13 is attached to the bottom ceramic layer by solder or epoxy; and bonding wires 14 carry electrical signals between the die 13 and patterned electrical conductors (not shown) which lie on the substrate layers. Those conductors carry the electrical signals to and from a plurality of input/output terminals 15 which extend perpendicular to substrate 11 around its periphery.

Also included in the integrated circuit package 10 is a ferromagnetic seal ring 16. It is permanently attached to substrate 11 around the periphery of the cavity 12 in a hermetic fashion, such as by soldering or welding. Suitably, ring 16 is comprised or iron, cobalt, nickel, or an alloy of those metals.

Further included in the integrated circuit package 10 is a lid 20 for cavity 12. This lid has a recessed center 21 which fits loosely inside of ring 16; and it has a raised periphery 22 which rests on top of the ring. Consequently, lid 20 aligns itself over cavity 12 when the recessed center 21 is in the cavity.

A permanent magnet 23 is attached in a fixed fashion, such as by an epoxy, to portion 22 of lid 20. Preferably, magnet 23 is comprised of permanently magnetized filings which are embedded in an elastic rubber. Thus, when magnet 23 is aligned with and placed on top of ring 16, the magnet and ring are pulled together and the rubber compresses to form a seal around the die.

In one actually constructed FIG. 1 package, lid 20 was made of aluminum and was 1.16"×1.36"×0.025"; lid portion 22 was 0.05" wide; and lid portion 21 was recessed by 0.037". Also, magnet 23 was 0.05" wide and 0.024" thick. Preferably, magnet 23 has a relatively high retentivity and attracts ring 16 with a force of at least twice the weight of the lid. Seal ring 16 was 0.030" high.

A primary feature of the FIG. 1 embodiment is that it protects the VLSI die in the package from contamination from the time they are initially attached to substrate 11 to the time they are hermetically sealed in the package. During that same time period, the package also protects the bonding wires 14 from mechanical damage. Typical sources of these contaminents and mechanical damage are pointed out in the Background portion of this document.

Another feature of the FIG. 1 embodiment is that no adhesive or other physical material is used to seal lid 20 to the seal ring 16. This is important because during the assembly procedure for the package, the lid has to be opened in order to replace defective die; and opening an adhesive or metallurgical seal would leave a residue or roughness on the seal ring. That in turn would degrade the quality of any hermetic seal which is attempted to be made on the seal ring at the end of the assembly process.

Yet another feature of the FIG. 1 embodiment is that magnet 23 and seal ring 16 have a low profile which does not interface with the insertion of package 10 into a fixture or socket. Such insertion usually is required when the package is electrically tested. By comparison, any mechanical clamp or latch that is added to the package to hold the lid in place is likely to increase the package's profile.

Also, since the lid 20 is very easy to open and reclose, the die in the package can be attached to the substrate and tested one at a time. Such an assembly procedure would be useful in situations where the die 13 have a very high power dissipation, and thus are required to be attached to substrate 11 via metallurgical bond which have a higher thermal conductivity than solder or epoxy but which are not repairable. In such a case, a considerable savings would be achieved if the die are attached and tested one at a time as opposed to bring attached all together and then tested.

Details of how this savings is achieved are as follows. Initially, just one of the integrated circuit 12 is attached and wire bonded to substrate 11. Thereafter, lid 20 is placed over cavity 11 and held there by means of magnet 23 and ring 16. Subsequently the package is moved to a test area in which the attached die is tested by applying input signals to some of the terminals 15 and analyzing the output signals which occur in response.

If the test indicates that the die is defective, the package is thrown away which results in a savings of the balance of the die which would be needed to complete the package. Conversely, if the attached die passes the test, the package 10 is moved back to the assembly area; lid 20 is removed; and another die is attached to substrate 11. Thereafter lid 20 is placed back on ring 16 and package 10 is moved back to the test area for testing. This process repeats until a defective die is found or the package is completed.

When a defective die is attached to the package in the above described process, that defective die is attached with equal probability as the first die, the second die, etc. Consequently, by using the above described process, half of the total die in the package on the average will still be unattached to the substrate when the defective die is discovered, and they will be salvaged for use in another package.

This compares favorably to the alternative of attaching all of the die to the substrate at the same time, hermetically sealing the die in the package, and then testing the package. If one of those die is found by testing to be defective, then all die must be discarded. This results in a loss of 100 percent more die than that which occurs when the die are attached and tested one at a time.

One could, of course, attempt to attach and test the die one at a time without utilizing any lid for protection of the die between the individual attach procedures. However, that would subject the die to contaminants and subject the bonding wires to mechanical breakage as previously described.

Figure 2:
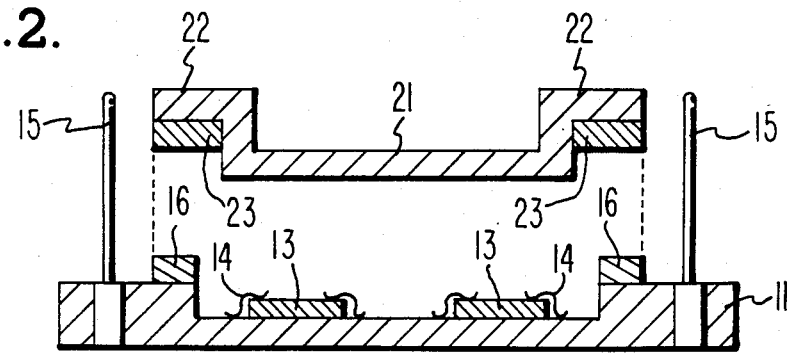
FIG. 2 is a cross-sectional view of the FIG. 1 embodiment.

A cross-sectional view of the FIG. 1 integrated circuit package 10 is illustrated in FIG. 2. This cross section is taken along lines 2—2 of FIG. 1. In FIGS. 1 and 2, corresponding components have like reference numerals.

Figure 3:
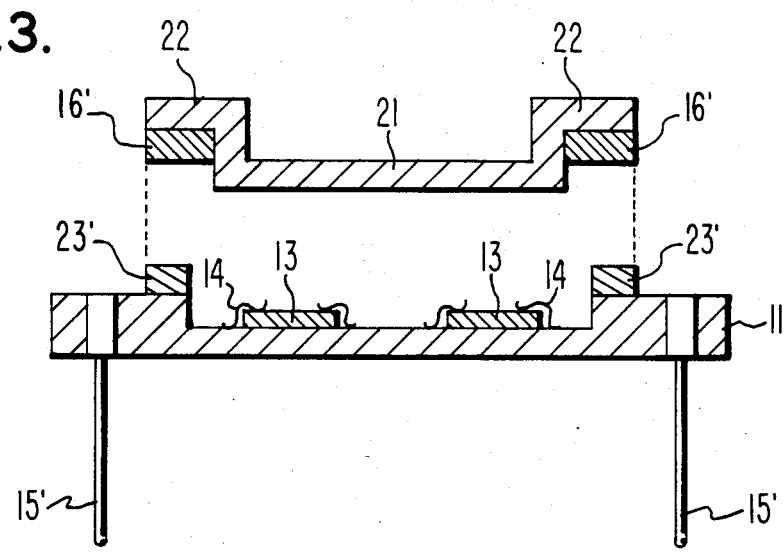
FIG. 3 is a cross-sectional view of another embodiment of the invention.

A modification to the embodiments of FIGS. 1 and 2 is illustrated in cross section in FIG. 3. In this modified embodiment, the position of the magnet and the iron ring which it attracts are interchanged. Reference numeral 23' indicates the magnet and reference numeral 16' indicates the iron ring. Another modification in the FIG. 3 embodiment is that the input/output terminals are indicated by reference 15' extend perpendicularly to the bottom surface (as opposed to the top surface) of substrate 11.

Various embodiments of the invention have now been described in detail. In addition, however, many changes and modifications can be made to the details of these embodiments without departing from the nature and spirit of the invention. Accordingly, it is to be understood that the invention is not limited to these details but is defined by the appended claims.

What is claimed is:

1. An improved integrated circuit package of the type which includes a substrate having a cavity used in holding multiple integrated circuit die, and includes a lid for covering said cavity to protect said die; wherein the improvement comprises a ferromagnetic member which is fixed to said substrate as a ring around said die, and a ring-shaped magnet which is fixed to said lid and coincides in shape to said ferromagnetic member for magnetically attracting said ferromagnetic member and holding said lid in place.

2. An integrated circuit package according to claim 1 wherein said magnet is imbedded in rubber which compresses against said ferromagnetic member to seal said cavity when said lid is held in place.

3. An integrated circuit package according to claim 1 wherein said lid has a recessed central region which fits into said ferromagnetic member and engages its sidewalls to self-align said magnet with said ferromagnetic member.

4. An integrated circuit package according to claim 1 wherein said ferromagnetic member is comprised of iron, nickel or cobalt.

5. An improved integrated circuit package of the type which includes a substrate used in holding multiple integrated circuit die, and includes a lid for covering and protecting said die; wherein said package further includes a magnet which is positioned in said package to magnetically hold said lid in place when said lid covers said die.

6. An integrated circuit package according to claim 5 wherein said magnet is fixedly attached to said lid.

7. An integrated circuit package according to claim 6 wherein said magnet is located at one or more sides of the perimeter of said lid.

8. An integrated circuit package according to claim 7 wherein said magnet is imbedded in a compressible rubber-like substance.

9. An integrated circuit package according to claim 8 wherein said substrate has a ferromagnetic member and said lid has a recess which aligns said magnet to said ferromagnetic member.

10. An integrated circuit package according to claim 5 wherein said magnet is fixedly attached to said substrate.

11. An integrated circuit package according to claim 10 wherein said magnet is located on one or more sides of said die.

12. An integrated circuit package according to claim 11 wherein said magnet is embedded in a compressible rubber-like substance.

13. An integrated circuit package according to claim 12 wherein said lid has a ferromagnetic member and a recess which aligns said magnet with said ferromagnetic member.

* * * * *